(12) United States Patent
Weiss et al.

(10) Patent No.: US 7,430,145 B2
(45) Date of Patent: Sep. 30, 2008

(54) SYSTEM AND METHOD FOR AVOIDING ATTEMPTS TO ACCESS A DEFECTIVE PORTION OF MEMORY

(75) Inventors: Donald R. Weiss, Fort Collins, CO (US); John Wuu, Fort Collins, CO (US); Charles Morrganti, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 11/229,084

(22) Filed: Sep. 16, 2005

(65) Prior Publication Data

US 2007/0079184 A1 Apr. 5, 2007

(51) Int. Cl.
*G11C 7/00* (2006.01)
(52) U.S. Cl. .................. 365/200; 365/189.07; 714/723

(58) Field of Classification Search ............ 365/200, 365/189.07; 714/723
See application file for complete search history.

(56) References Cited

U.S. PATENT DOCUMENTS

| 5,200,959 | A | * | 4/1993 | Gross et al. ............... 714/723 |
| 5,805,604 | A | * | 9/1998 | Nishikawa ............... 714/701 |
| 6,427,188 | B1 | | 7/2002 | Lyon et al. |
| 6,647,464 | B2 | | 11/2003 | Riedlinger et al. |
| 2004/0030957 | A1 | * | 2/2004 | Yadavalli et al. ............. 714/30 |
| 2004/0085796 | A1 | * | 5/2004 | Tatsumi ..................... 365/63 |

* cited by examiner

*Primary Examiner*—Huan Hoang

(57) ABSTRACT

According to one embodiment, a method comprises detecting a defect in a portion of memory. The method further comprises designating the portion of memory as defective, and avoiding attempts to access the portion of memory designated as defective.

21 Claims, 6 Drawing Sheets

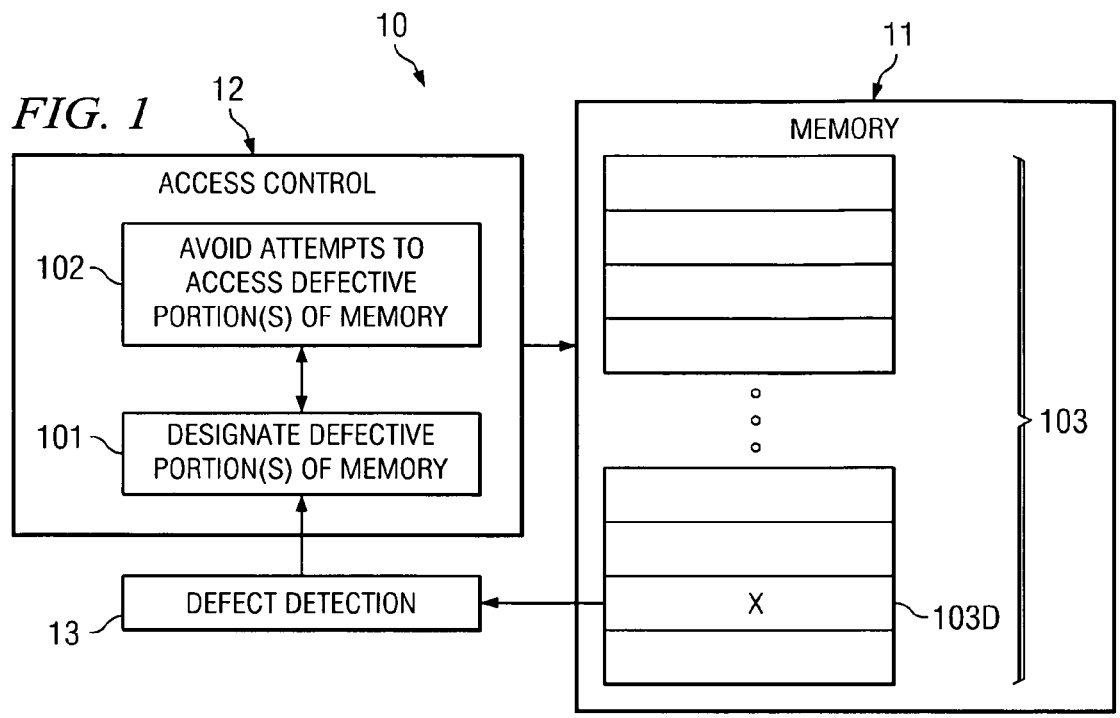
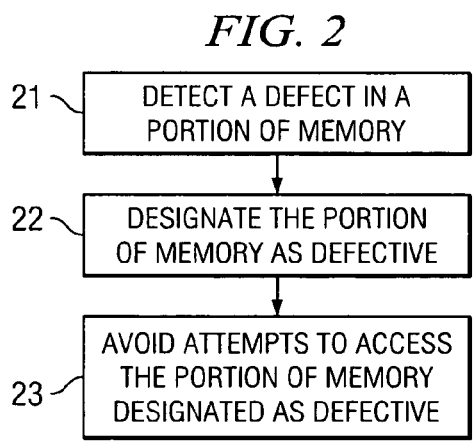

SYSTEM AND METHOD FOR AVOIDING ATTEMPTS TO ACCESS A DEFECTIVE PORTION OF MEMORY

FIELD OF THE INVENTION

The following description relates generally to handling defects encountered in memory, and more particularly to systems and methods for avoiding attempts to access a defective portion of memory.

DESCRIPTION OF RELATED ART

Data storage, referred to generically herein as "memory," is commonly implemented in computer systems. For instance, random access memory ("RAM") is commonly implemented within computer systems. Computer systems may employ a multi-level hierarchy of memory, with relatively fast, expensive but limited-capacity memory at the lowest level of the hierarchy and proceeding to relatively slower, lower cost but higher-capacity memory at the highest level of the hierarchy. The hierarchy may include a fast memory called a cache, either physically integrated within a processor or mounted physically close to the processor for speed. The computer system may employ separate instruction caches ("I-caches") and data caches ("D-caches"). In addition, the computer system may use multiple levels of caches. The use of a cache is generally transparent to a computer program at the instruction level and can thus be added to a computer architecture without changing the instruction set or requiring modification to existing programs. Generally, RAM may be implemented within any such level of a multi-level hierarchy of memory utilized for a computer system.

Various RAM chips have been developed in the prior art to allow data to be moved in and out of memory quickly, to avoid errors, and to make collections of RAM chips smaller. The most common types of RAM include dynamic random access memory (DRAM), Extended Data Out random access memory (EDO RAM), video random access memory (VRAM), static random access memory (SRAM), synchronous DRAM (SDRAM), single in-line memory modules (SIMM), and dual in-line memory modules (DIMM).

From time-to-time a defect may occur within a portion of memory. Such defect may occur and be detected during manufacturing (or "fabricating") the memory (e.g., RAM chip), or such defect may be a latent defect that is not detected until after the memory chip has been supplied by the manufacturer. Latent defects may be caused, for example, due to aging, stresses, and/or actual use of the memory, which results in functional errors from the point of view of the memory. Thus, latent defects refer to defects that were not present (or did not manifest themselves) during the testing and production of the memory.

Because computer systems and applications executing thereon rely heavily on accurate performance of memory for storing data, various techniques have been developed for detecting and correcting defects in memory. For example, error correction code (ECC) and/or parity checking techniques are commonly employed for detecting defective data in memory and/or correcting such defective data. ECC allows data that is being read or transmitted to be checked for errors and, when necessary, corrected on the fly. As an example of a common ECC scheme, when a unit of data (or "word") is stored in memory, a code that describes the bit sequence in the word is calculated and stored along with the unit of data. When the unit of data is requested for reading, a code for the stored and about-to-be-read word is again calculated using the original algorithm. The newly generated code is compared with the code generated when the word was stored. If the codes match, the data is free of errors and is sent. If the codes do not match, however, the missing or erroneous bits are determined through the code comparison and the bit or bits are supplied or corrected. Typically, no attempt is made by the ECC technique to correct the data that is still in storage, as it eventually it will be overlaid by new data and, assuming the errors were transient, the incorrect bits will be replaced with correct bits. Any error that recurs at the same place (i.e., same address) in memory after the system has been turned off and on again may indicate a permanent hardware error and a message may be generated and sent to a log or to a system administrator indicating the location with the recurrent errors.

Generally, error correcting techniques, such as ECC are employed for single-bit correction. Double-bit (or greater) correction is often too complex/expensive to implement for a given system, although such error correction techniques may be employed if so desired. An error in memory may be either a soft error (transient error) or a hard error (permanent error). Soft errors are fairly rare events caused, for example, by alpha particles or cosmic rays hitting the silicon and flipping the bit. Such soft errors are momentary (transient) events, rather than permanent defects, and so upon occurrence of such a soft error the memory cell can be rewritten and it will resume working properly. With hard (or "permanent") errors, every time a defective memory location is accessed it results in an ECC or parity error.

Each time that an error correction technique (e.g., ECC) is employed, it slows the system down because time is required for performing the correction before the data can be served from memory. A technique referred to as inline ECC correction is employed in certain systems, wherein ECC correction is employed for correcting every memory access, not just the ones with a defect. However, this results in a performance penalty, which is generally a central processing unit (CPU) cycle or two, for each memory access. In other systems, ECC may be employed only for correcting defects. As mentioned above, ECC is typically implemented to provide single-bit error correction. Thus, if a double-bit error occurs, the system generally crashes the application accessing memory or in some instances the entire system. Thus, if a hard error is present for a bit of a memory address, such bit can be corrected each time it is accessed via ECC correction, incurring a performance penalty. If single-bit correction is employed and a hard error is present for one bit of a memory address, then occurrence of a soft or hard error on another bit of the memory addressed results in a double-bit error that cannot be corrected and generally results in crashing the application or the system. Thus, a desire exists for a technique for handling memory defects that does not unduly diminish system performance while also guarding against data errors and maintaining a high level of system up time (e.g., as desired for high availability systems).

BRIEF DESCRIPTION OF THE DRAWINGS

FIG. 1 shows a block diagram of an exemplary system employing an embodiment of the present invention;

FIG. 2 shows an operational flow diagram of one embodiment of the present invention;

DETAILED DESCRIPTION

Figure 3:
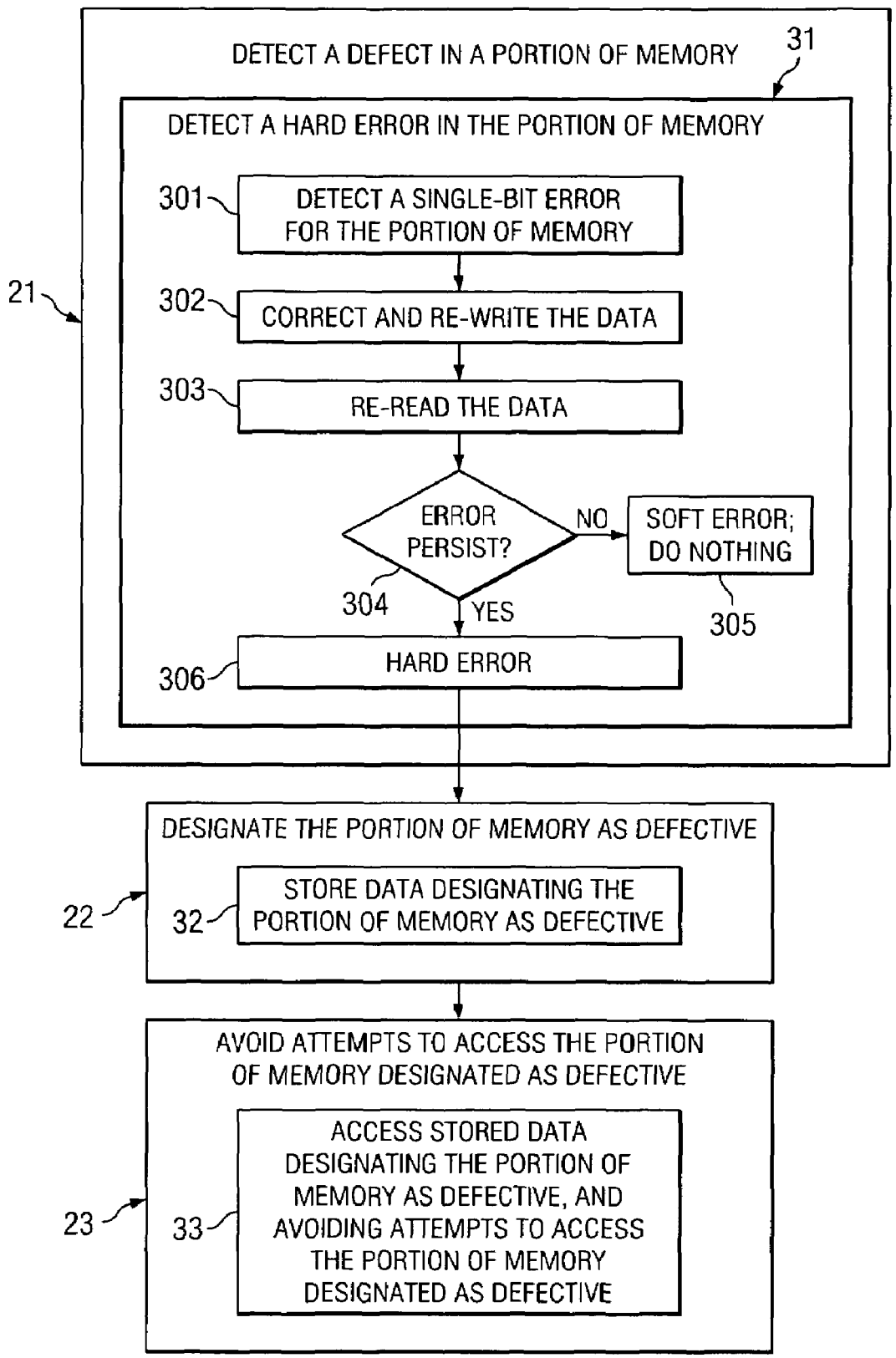
FIG. 3 shows an operational flow diagram providing further details regarding how the operational blocks of FIG. 2 are implemented in accordance with one embodiment of the present invention.

In general, systems and methods are provided herein for avoiding attempts to access a defective portion of memory. That is, techniques are provided for detecting a defect in a portion of memory, and dynamically avoiding future attempts to access the defective portion of memory. The data originally stored to the defective portion of memory may be moved to another portion of memory. For instance, upon a defect being detected in a level of cache, the correct data may be written to main memory. The defective portion of memory is designated as defective (e.g., via stored data), and access control mechanisms avoid future accesses to such defective portion of memory. Accordingly, the overall size of memory is effectively reduced once the defective portion is designated as defective, as such defective portion is not available for future accesses. However, system performance can be maintained at a high level because the defective portion of memory is not accessed in the future and thus time need not be spent correcting data from such defective portion of memory. Furthermore, such defects generally arise fairly infrequently and thus relatively small portions of memory may become defective over the typical life of a system in which the memory is employed. Further, when employing a single-bit error correction scheme, the exemplary techniques provided herein avoid the potential for later incurring a double-bit error because a hard single-bit error detected for a portion of memory results in that potion of memory designated as defective and not used for future accesses. Accordingly, system up time can be maintained while also maintaining a high level of performance.

FIG. 1 shows a block diagram of an exemplary system 10 employing an embodiment of the present invention. System 10 includes memory 11 having portions (e.g. addresses) 103 which in this example include a defective portion 103D. System 10 further includes access control logic 12, which controls access to memory 11. System 10 also includes defect detection logic 13, which is operable to detect defective portions of memory 11 such as portion 103D in the example of FIG. 1. In this example, access control logic 12 includes logic 101 ("designation" logic) for designating defective portions of memory and logic 102 ("defect avoidance" logic) that is operable to avoid attempts to access portions of memory that are designated as defective.

Defect detection logic 13 is operable to detect a defective portion of memory 11, such as portion 103D shown in FIG. 1. More particularly, defect detection logic 13 is operable to detect hard errors within memory 11, and update designation logic 101 to designate any portions of memory for which hard errors are detected as defective. Defect detection logic 13 may further detect soft errors in memory 11, and because such soft errors are transient, error correction may be performed to correct the soft error and the defect detection logic 13 does not update designation logic 101 to designate the corresponding portion of memory as defective. Thus, defect detection logic 13 may detect portions of memory for which hard errors are encountered as being defective, while any portion of memory for which a soft error is encountered is not determined as defective (but rather the soft error is transient and is therefore corrected). Various techniques may be used for implementing defect detection logic 13, examples of which are discussed further below.

Accordingly, in this example when defect detection logic 13 detects a defective portion of memory 11 (e.g. a portion of memory for which a hard error is encountered), such as portion 103D, defect detection logic 13 updates designation logic 101. In certain embodiments, designation logic 101 comprises data that designates portions of memory 11 that have been detected as defective by defect detection logic 13. As described further below, such designation logic 101 may comprise, as examples, one or more bits implemented within a tag array, one or more bits implemented within a replacement array, one or more bits included in a MESI (modified, exclusive, shared, or invalid) code, or other data structure for storing data designating a portion of memory as defective. Defect avoidance logic 102 avoids attempts to access portions of memory 11 that are designated by designation logic 101 as defective.

Turning to FIG. 2, an operational flow diagram of one embodiment of the present invention is shown. In operational block 21, a defect is detected in a portion of memory. For instance, defect detection logic 13 (FIG. 1) detects a defective portion 103D of memory 11. In operational block 22, the portion of memory is designated as defective. For example, information may be stored to a data structure designating the portion of memory as defective. In FIG. 1, for instance, defect detection logic 13 may write data to designation logic 101 designating defective portion 103D as defective. In operational block 23, attempts to access the portion of memory designated as defective are avoided. That is, the information designating the portion of memory as defective is used for avoiding future attempts to access such defective portion of memory. In FIG. 1, for instance, avoidance logic 102 of access control logic 12 uses the information in designation logic 101 to avoid attempting accesses of any portions of memory 11 that are designated in designation logic 101 as defective, such as portion 103D.

FIG. 3 shows an operational flow diagram providing further details regarding how the operational blocks of FIG. 2 are implemented in accordance with one embodiment of the present invention. As shown, in this example, detecting a defect in a portion of memory in operational block 21 includes operational block 31 for detecting a hard error in the portion of memory. That is, a determination is made as to whether a hard error is detected for the portion of memory in determining whether the portion of memory is defective. Operational block 31 includes operational blocks 301-306, which in certain embodiments are performed by defect detection logic 13 of FIG. 1. In operational block 301, a single-bit error is detected for the portion of memory. In operational block 302, an attempt is made to correct and re-write the data to the portion of memory, and in operational block 303 the data is re-read from the portion of memory. In operational block 304, a determination is made whether the error persists. That is, a determination is made as to whether the corrected data that was re-written to the memory is correctly read from the memory. If the error does not persist (i.e., re-writing the corrected data in block 302 corrected the error), then operation advances to block 305 where the error is determined to have been a soft error (transient error) and thus the portion of memory is not determined to be defective. On the other hand, if determined in block 304 that the error persists, then operation advances to block 306 where the error is determined to be a hard error and is thus indicative of the portion of memory being defective. The re-testing process (303-306) may be more complex than the single re-read and compare shown here and may involve more exhaustive test patterns and/or hardware Built-In Self-Test (BIST) in other embodiments.

Operation advances from block 306 to operational block 22, which in this example includes operational block 32 for storing data designating the portion of memory as defective. Operation then advances to block 23, which in this example includes operational block 33 where the stored data designating the portion of memory as defective is accessed and used for avoiding attempts to access this defective portion of memory. That is, access control logic 12 (of FIG. 1) determines from the stored data designating the portion of memory as defective that such portion of memory is defective, and thus access control logic 12 avoids attempts to access this defective portion of memory.

Figure 4:
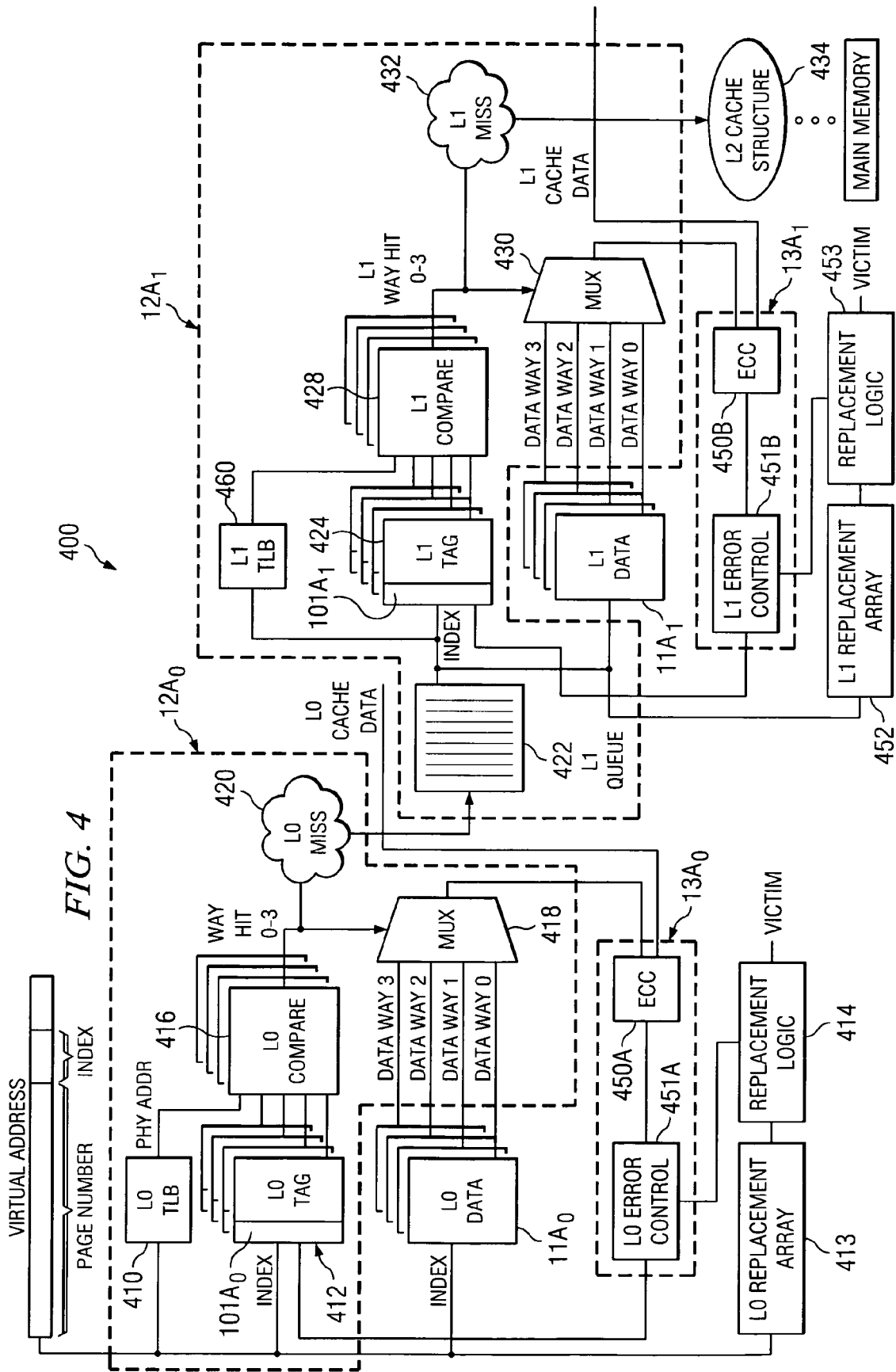
FIG. 4 shows an exemplary system employing one embodiment of the present invention, wherein bits are included in a tag array for designating defective portions of memory.

FIG. 4 shows an exemplary system 400 employing one embodiment of the present invention, wherein bits are included in a tag array for designating defective portions of memory. System 400 includes an exemplary multi-level cache design that may be implemented. The exemplary cache design of FIG. 4 is provided merely for illustrative purposes and represents how a cache design commonly employed in computer systems may be adapted to implement one embodiment of the present invention. Of course, embodiments of the present invention are not limited in application to the exemplary cache design shown in FIG. 4, but may be readily employed in various other cache designs as those of ordinary skill in the art will appreciate. System 400 has a three-level cache hierarchy, with the first level referred to as L0, the second level referred to as L1, and the third level referred to as L2. It should be understood that other implementations of a cache may have any number of levels (more or less than three).

As discussed more fully hereafter, multi-level caches of the prior art are often designed such that a processor accesses each level of cache in series until the desired address is found. For example, in the exemplary system 400 of FIG. 4, when an instruction desires access to an address, the processor accesses the first-level cache L0 to try to satisfy the address request (i.e., to try to locate the desired address). If the address is not found in L0, the processor then accesses the second-level cache L1 to try to satisfy the address request. If the address is not found in L1, the processor proceeds to access each successive level of cache in a serial manner until the requested address is found, and if the requested address is not found in any of the cache levels, the processor then sends a request to the system's main memory to try to satisfy the request.

Again, embodiments of the present invention are not limited in application to the design of FIG. 4 but may instead be employed in any cache design and/or access scheme now known or later discovered. For instance, a more efficient cache architecture that does not require progression through the various levels of cache in a serial fashion has been developed, such as is disclosed in U.S. Pat. No. 6,427,188 entitled "METHOD AND SYSTEM FOR EARLY TAG ACCESSES FOR LOWER-LEVEL CACHES IN PARALLEL WITH FIRST-LEVEL CACHE" and in U.S. Pat. No. 6,647,464 entitled "SYSTEM AND METHOD UTILIZING SPECULATIVE CACHE ACCESS FOR IMPROVED PERFORMANCE". It will be appreciated that embodiments of the present invention may be implemented within, as examples, a cache structure such as that of FIG. 4, or within other (e.g., more efficient) cache structures such as those disclosed in U.S. Pat. Nos. 6,427,188 and 6,647,464 as examples.

In the example of FIG. 4, when an instruction requires access to a particular address, a virtual address is provided from the processor to the cache system. As is well-known in the art, such virtual address typically contains an index field and a virtual page number field. The virtual address is input into a translation look-aside buffer ("TLB") 410 for the L0 cache. The TLB 410 provides a translation from a virtual address to a physical address. The virtual address index field is input into the L0 tag memory array(s) 412. As shown in FIG. 4, the L0 tag memory array 412 may be duplicated N times within the L0 cache for N "ways" of associativity. Such "ways" are well known in the art, and the term "way" is used herein consistent with its ordinary meaning as applied within the field to cache memory, generally referring to a partition of the lower-level cache that enables associativity. For example, the lower-level cache of a system may be partitioned into any number of ways. Ways of associativity are well-known in the art and therefore are not described further herein so as not to detract from the description of the embodiments of the present invention. As shown in FIG. 4, the virtual address index is also input into the L0 data array structure(s) (or "memory structure(s)") $11A_0$, which may also be duplicated N times for N ways of associativity. The L0 data array structure(s) $11A_0$ form at least a portion of memory 11 of FIG. 1 and comprise the data stored within the L0 cache, which may be partitioned into several ways.

The L0 tag 412 outputs a physical address for each of the ways of associativity. That physical address is compared with the physical address output by the L0 TLB 410. These addresses are compared in compare circuit(s) 416, which may also be duplicated N times for N ways of associativity. The compare circuit(s) 416 generate a "hit" signal that indicates whether a match is made between the physical addresses. As used herein, a "hit" means that the data associated with the address being requested by an instruction is contained within a particular cache. As an example, suppose an instruction requests an address for a particular data labeled "A." The data label "A" would be contained within the tag (e.g., the L0 tag 412) for the particular cache (e.g., the L0 cache), if any, that contains that particular data. That is, the tag for a cache level, such as the L0 tag 412, represents the data that is residing in the data array for that cache level. Therefore, the compare circuitry, such as compare circuitry 416, basically determines whether the incoming request for data "A" matches the tag information contained within a particular cache level's tag (e.g., the L0 tag 412). If a match is made, indicating that the particular cache level contains the data labeled "A," then a hit is achieved for that particular cache level.

Typically, the compare circuit(s) 416 generate a single signal for each of the ways, resulting in N signals for N ways of associativity, wherein such signal indicates whether a hit was achieved for each way. The hit signals (i.e., "L0 way hits") are used to select the data from the L0 data array(s) $11A_0$, typically through multiplexer ("MUX") 418. As a result, MUX 418 provides the cache data from the L0 cache if a way hit is found in the L0 tags. If the signals generated from the compare circuitry 416 are all zeros, meaning that there are no hits within the L0 cache, then "miss" logic 420 is used to generate a L0 cache miss signal. Such L0 cache miss signal then triggers control to send the memory instruction to the L1 queue 422, which queues (or holds) memory instructions that are waiting to access the L1 cache. Accordingly, if it is determined that the desired address is not contained within the L0 cache, a request for the desired address is then made to the L1 cache.

In turn, the L1 queue 422 feeds the physical address index field for the desired address into the L1 TLB 460 and the L1 tag(s) 424, which may be duplicated N times for N ways of associativity. The physical address index is also input to the L1 data array(s) $11A_1$, which may also be duplicated N times for N ways of associativity. The L1 data array structure(s) $11A_1$ form at least a portion of memory 11 of FIG. 1 and comprise the data stored within the L1 cache, which may be partitioned into several ways. The L1 tag(s) 424 output a physical address for each of the ways of associativity to the L1 compare circuit(s) 428. The L1 compare circuit(s) 428 compare the physical address output by L1 tag(s) 424 with the physical address output by the L1 TLB 460. The L1 compare circuit(s) 428 generate an L1 hit signal(s) for each of the ways of associativity indicating whether a match between the physical addresses was made for any of the ways of L1. Such L1 hit signals are used to select the data from the L1 data array(s) 426 utilizing MUX 430. That is, based on the L1 hit signals input to MUX 430, MUX 430 outputs the appropriate L1 cache data from L1 data array(s) 426 if a hit was found in the L1 tag(s) 424. If the L1 way hits generated from the L1 compare circuitry 428 are all zeros, indicating that there was no hit generated in the L1 cache, then a miss signal is generated from the "miss" logic 432. Such a L1 cache miss signal generates a request for the desired address to the L2 cache structure 434, which is typically implemented in a similar fashion as discussed above for the L1 cache. Additional levels of hierarchy may be added after the L2 cache, as desired, in a similar manner as discussed above for levels L0 through L2. Finally, if a hit is not achieved in the last level of cache (e.g., L2 of FIG. 1), then the memory request is sent to the processor system bus to access the main memory of the system.

As shown in the example of FIG. 4, access control logic $12A_0$ is implemented for controlling access to the L0 data array $11A_0$, and access control logic $12A_1$ is implemented for controlling access to the L1 data array $11A_1$. These provide exemplary implementations of access control logic 12 of FIG. 1. In this exemplary embodiment, one or more bits of data are included within the tag arrays 412 and 424 for implementing the designation logic 101 of FIG. 1. For instance, bit(s) $101A_0$ and $101A_1$ are included within tag arrays 412 and 424, respectively, for designating whether a portion of memory is defective. More particularly, bit(s) $101A_0$ within tag array 412 designate any defective portions of the L0 data array $11A_0$, and bit(s) $101A_1$ within tag array 424 designate any defective portions of the L0 data array $11A_1$.

In the example of FIG. 4, an exemplary implementation of defect detection logic 13 of FIG. 1 is shown. This exemplary implementation includes L0 defect detection logic $13A_0$, which includes ECC logic 450A and hardware or firmware error control logic 451A to process an error detected in L0, and L1 defect detection logic $13A_1$, which includes ECC logic 450B and hardware or firmware error control logic 451B to process an error detected in L1. Of course, defect detection logic 13 is not limited to this exemplary implementation, but logic $13A_0$ and $13A_1$ provide one illustrative implementation that may be employed.

ECC logic 450A performs error detection for the L0 cache data from data arrays $11A_0$, and ECC logic 450B performs error detection for the L1 cache data read from data arrays $11A_1$ in the manner well-known in the art. Upon detecting an error in the L0 cache data, ECC logic 450A signals the error and signals error control logic 451A (e.g., via an interrupt). Error control logic 451A re-writes the corrected data (corrected by ECC logic 450A) to the memory address from which it was read, and then re-reads the data to determine whether the error is a soft error or a hard error (as in operational blocks 302-306 of FIG. 3). If determined that the error is a hard error, then error control logic 451A updates the defect designation bit(s) in the tag array to designate the corresponding memory address for which the error was detected as defective. For instance, if a hard error is detected for L0 data array $11A_0$, then error control logic 451A updates the corresponding defect designation bit(s) $101A_0$ in tag array 412 to designate the portion of L0 data array $11A_0$ for which the hard error is detected (e.g., the cache line for which the hard error is detected) as being defective. The L1 defect detection logic $13A_1$ works in a like manner for errors encountered in the L1 cache data. For instance, if a hard error is detected for L1 data array $11A_1$, then error control logic 451B updates the corresponding defect designation bit(s) $101A_1$ in tag array 424 to designate the portion of L1 data array $11A_1$ for which the hard error is detected (e.g., the cache line for which the hard error is detected) as being defective.

In this embodiment, the use of defective lines is prevented during allocation of new lines. In this example, L0 replacement array 413 and replacement logic 414 are implemented for the L0 cache, and L1 replacement array 452 and replacement logic 453 are implemented for the L1 cache. In this exemplary embodiment, replacement arrays 413 and 452 are included for L0 and L1, respectively, in a manner as is commonly employed in the art. Replacement arrays 413 and 452 are commonly used in cache structures for storing information about the usage of lines in the L0 and L1 caches, respectively. When space must be made available for a new line to be brought in from the next level cache in the hierarchy, the replacement logic 414 and 453 can select an appropriate way to replace, also known as the victim. Replacement logic 414 and 453 determine the location or way to place a new line based on information stored in the replacement arrays 413 and 452, respectively. Implementations of such replacement arrays and replacement logic for evicting cache lines from a given level of cache and inserting a new cache line (e.g., to maintain the most recently accessed data in the cache) are well known in the art, and are thus not described in further detail herein. As discussed further below, certain embodiments of the present invention adapt the replacement arrays and/or replacement logic and leverage them for use in avoiding attempts to access defective portions of memory.

In this embodiment, bits $101A_0$ are used by error control logic 451A to signal replacement logic 414 to prevent the defective line detected for the L0 cache data from ever being allocated. Similarly, bits $101A_1$ are used by error control logic 451B to signal replacement logic 453 to prevent the defective line detected for the L1 cache data from ever being allocated. According to certain embodiments of the present invention, the replacement algorithm (whichever one is implemented in a given system) is adapted to ensure two things: 1) that the defective locations are never selected as the victim (never allocated); and 2) that a suitable alternative victim is always chosen to ensure forward progress.

Figure 5:
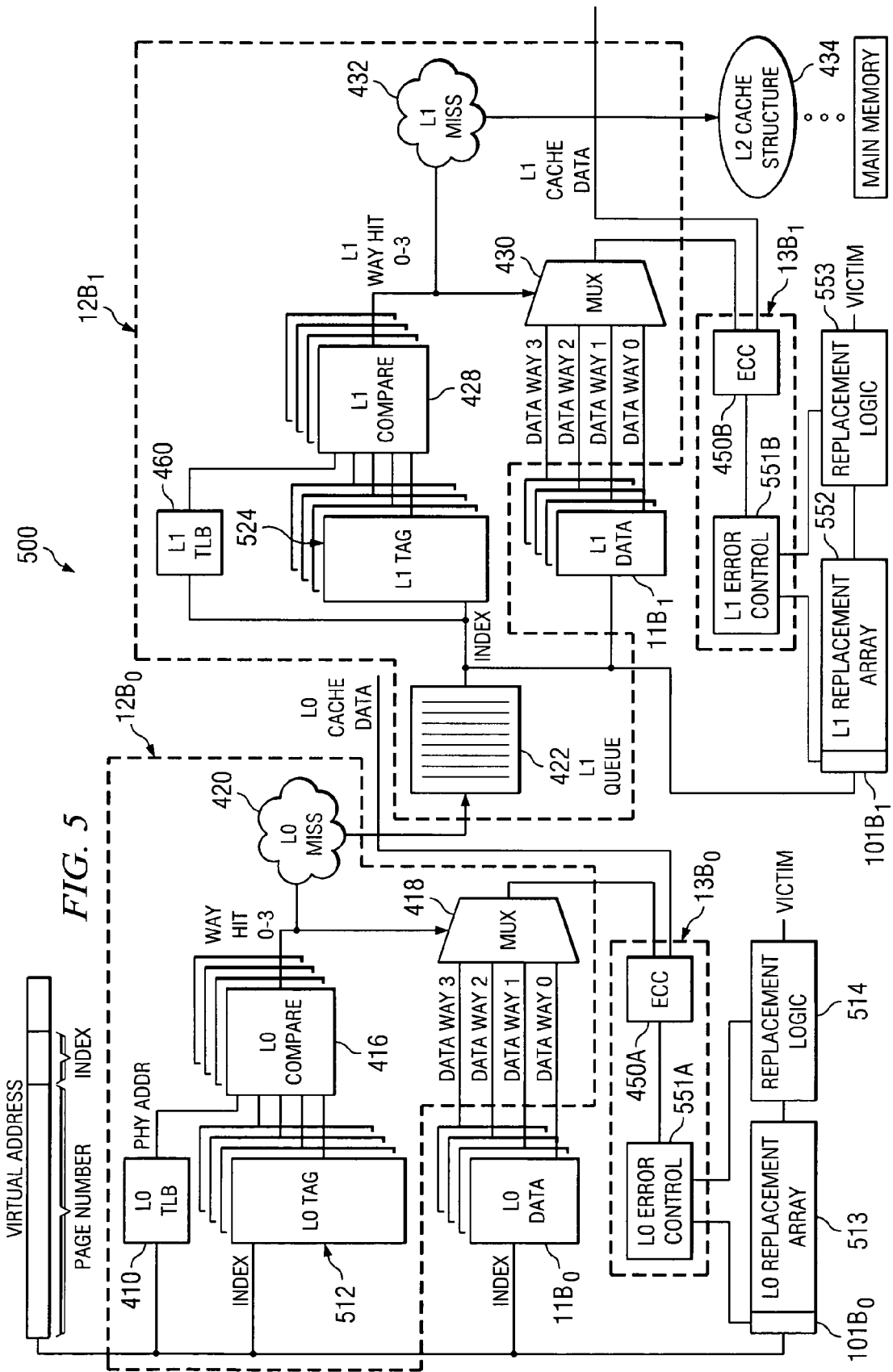
FIG. 5 shows an exemplary system employing another embodiment of the present invention, wherein bits are included in a replacement array for designating defective portions of memory.

FIG. 5 shows an exemplary system 500 employing another embodiment of the present invention, wherein additional bits are included in a replacement array for designating defective portions of memory. System 500 includes an exemplary multi-level cache design, such as that described above with FIG. 4. As with FIG. 4, the exemplary cache design of FIG. 5 is provided merely for illustrative purposes and represents how a cache design commonly employed in computer systems may be adapted to implement one embodiment of the present invention. Of course, embodiments of the present invention are not limited in application to the exemplary cache design shown in FIG. 5, but may be readily employed in various other cache designs as those of ordinary skill in the art will appreciate.

As shown in the example of FIG. 5, access control logic $12B_0$ is implemented for controlling access to the L0 data array $11B_0$, and access control logic $12B_1$ is implemented for controlling access to the L1 data array $11B_1$. These provide exemplary implementations of access control logic 12 of FIG. 1. In this exemplary embodiment, replacement arrays 513 and 552 are included for L0 and L1, respectively, in a manner as is commonly employed in the art. Replacement arrays 513 and 552 are used for storing information about the usage of lines in the L0 and L1 caches, respectively. As discussed above with FIG. 4, when space must be made available for a new line to be brought in from the next level cache in the hierarchy, the replacement logic 514 and 553 can select an appropriate way to replace, also known as the victim. In this embodiment, one or more bits of data are included within the replacement arrays 513 and 552 for implementing the designation logic 101 of FIG. 1. For instance, bit(s) $101B_0$ and $101B_1$ are included within replacement arrays 513 and 552, respectively, for designating whether a portion of memory is defective. More particularly, bit(s) $101B_0$ within replacement array 513 designate any defective portions of the L0 data array $11B_0$, and bit(s) $101B_1$ within replacement array 552 designate any defective portions of the L0 data array $11B_1$.

In the example of FIG. 5, an exemplary implementation of defect detection logic 13 of FIG. 1 is shown. This exemplary implementation includes L0 defect detection logic $13B_0$, which includes ECC logic 450A and hardware or firmware error control logic 551A to process an error detected in L0, and L1 defect detection logic $13B_1$, which includes ECC logic 450B and hardware or firmware error control logic 551B to process an error detected in L1. Of course, defect detection logic 13 is not limited to this exemplary implementation, but logic $13B_0$ and $13B_1$ provide one illustrative implementation that may be employed.

ECC logic 450A performs error detection for the L0 cache data from data arrays $11B_0$, and ECC logic 450B performs error detection for the L1 cache data read from data arrays $11B_1$ in the manner well-known in the art. Upon detecting an error in the L0 cache data, ECC logic 450A signals the error and signals error control logic 551A (e.g., via an interrupt). Error control logic 551A re-writes the corrected data (corrected by ECC logic 450A) to the memory address from which it was read, and then re-reads the data to determine whether the error is a soft error or a hard error (as in operational blocks 302-306 of FIG. 3). If determined that the error is a hard error, then error control logic 551A updates the defect designation bit(s) in the replacement array to designate the corresponding memory address for which the error was detected as defective. For instance, if a hard error is detected for L0 data array $11B_0$, then error control logic 551A updates the corresponding defect designation bit(s) $101B_0$ in L0 replacement array 513 to designate the portion of L0 data array $11B_0$ for which the hard error is detected (e.g., the cache line for which the hard error is detected) as being defective. The L1 defect detection logic $13B_1$ works in a like manner for errors encountered in the L1 cache data. For instance, if a hard error is detected for L1 data array $11B_1$, then error control logic 551B updates the corresponding defect designation bit(s) $101B_1$ in L1 replacement array 552 to designate the portion of L1 data array $11B_1$ for which the hard error is detected (e.g., the cache line for which the hard error is detected) as being defective.

In this exemplary embodiment of FIG. 5, the use of defective lines is prevented during allocation of new lines. Typically, replacement logic 514 and 553 determine the location or way to place a new line based on information stored in the replacement arrays 513 and 552, respectively. In this embodiment, bits $101B0$ and $101B1$ are used by error control logic 551A and 551B to signal replacement logic 514 and 553 to prevent the defective line from ever being allocated.

Figure 6:
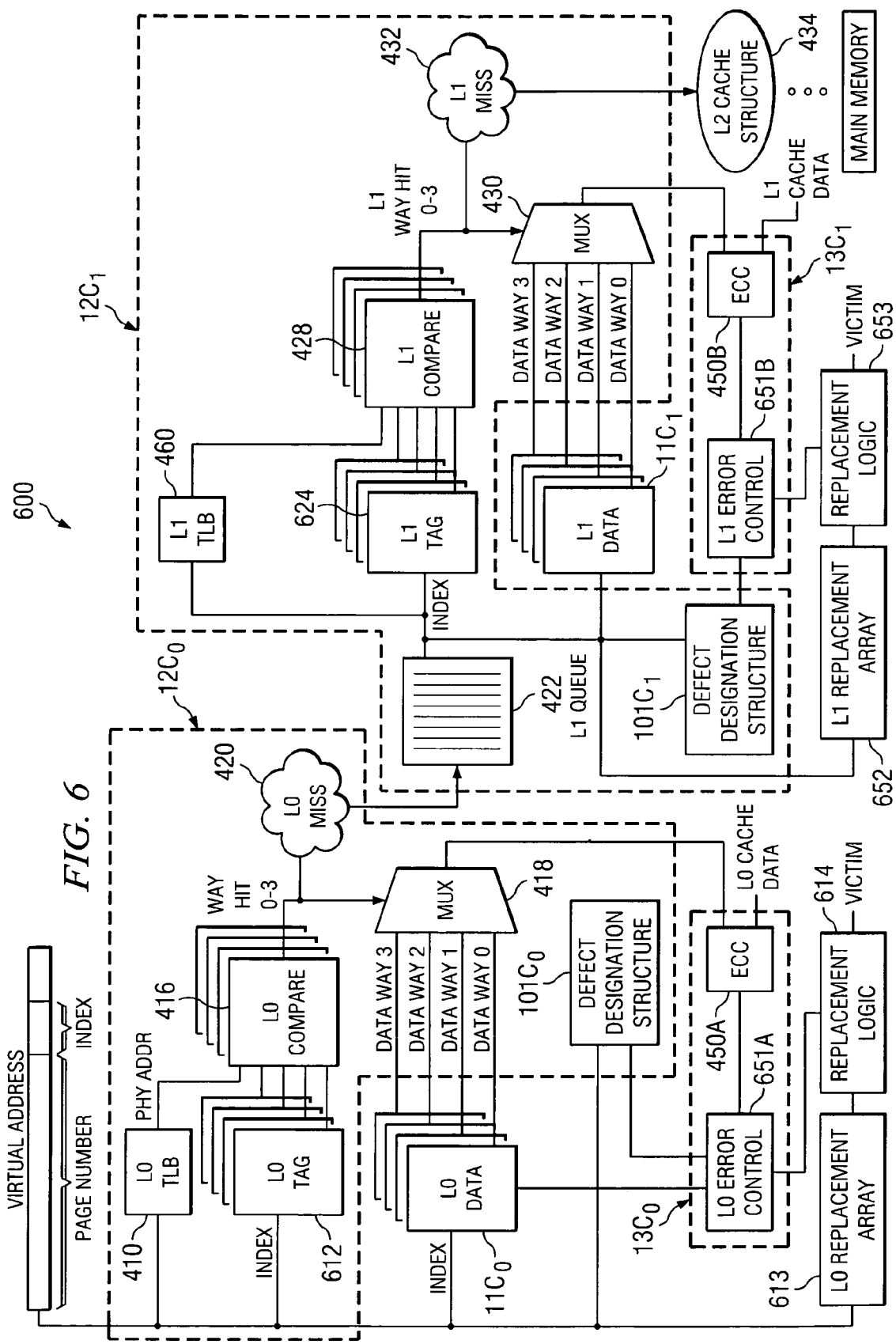
FIG. 6 shows an exemplary system employing yet another embodiment of the present invention, wherein bits are included in a separate defect designation structure for designating defective portions of memory.

FIG. 6 shows an exemplary system 600 employing yet another embodiment of the present invention, wherein bits are included in a separate defect designation structures $101C_0$ and $101C_1$ (for L0 and L1, respectively) for designating defective portions of memory (rather than implementing such defect designation bits in a tag array or replacement array as in FIGS. 4 and 5). System 600 includes an exemplary multi-level cache design, such as that described above with FIG. 4. As with FIG. 4, the exemplary cache design of FIG. 6 is provided merely for illustrative purposes and represents how a cache design commonly employed in computer systems may be adapted to implement one embodiment of the present invention. Of course, embodiments of the present invention are not limited in application to the exemplary cache design shown in FIG. 6, but may be readily employed in various other cache designs as those of ordinary skill in the art will appreciate.

As shown in the example of FIG. 6, access control logic $12C_0$ is implemented for controlling access to the L0 data array $11C_0$, and access control logic $12C_1$ is implemented for controlling access to the L1 data array $11C_1$. These provide exemplary implementations of access control logic 12 of FIG. 1. In this exemplary embodiment, defect designation structures $101C_0$ and $101C_1$ are included. In this embodiment, data is included within the defect designation structures $101C_0$ and $101C_1$ for implementing the designation logic 101 of FIG. 1. More particularly, data is included within defect designation structure $101C_0$ to designate any defective portions of the L0 data array $11C_0$, and data is included within defect designation structure $101C_1$ to designate any defective portions of the L0 data array $11C_1$.

In the example of FIG. 6, an exemplary implementation of defect detection logic 13 of FIG. 1 is shown. This exemplary implementation includes L0 defect detection logic $13C_0$, which includes ECC logic 450A and hardware or firmware error control logic 651A to process an error detected in L0, and L1 defect detection logic $13C_1$, which includes ECC logic 450B and hardware or firmware error control logic 651B to process an error detected in L1. Of course, defect detection logic 13 is not limited to this exemplary implementation, but logic $13C_0$ and $13C_1$ provide one illustrative implementation that may be employed.

ECC logic 450A performs error detection for the L0 cache data from data arrays $11C_0$, and ECC logic 450B performs error detection for the L1 cache data read from data arrays $11C_1$ in the manner well-known in the art. Upon detecting an error in the L0 cache data, ECC logic 450A signals the error and signals error control logic 651A (e.g., via an interrupt). Error control logic 651A re-writes the corrected data (corrected by ECC logic 450A) to the memory address from which it was read, and then re-reads the data to determine whether the error is a soft error or a hard error (as in operational blocks 302-306 of FIG. 3). If determined that the error is a hard error, then error control logic 651A updates the defect designation bit(s) in the L0 defect designation structure to designate the corresponding memory address for which the error was detected as defective. For instance, if a hard error is detected for L0 data array $11C_0$, then error control logic 651A updates the corresponding defect designation bit(s) of L0 defect designation structure $101C_0$ to designate the portion of L0 data array $11C_0$ for which the hard error is detected (e.g., the cache line for which the hard error is detected) as being defective. The L1 defect detection logic $13C_1$ works in a like manner for errors encountered in the L1 cache data. For instance, if a hard error is detected for L1 data array $11C_1$, then error control logic 651B updates the corresponding defect designation bit(s) of L1 defect designation structure $101C_1$ to designate the portion of L1 data array $11C_1$ for which the hard error is detected (e.g., the cache line for which the hard error is detected) as being defective.

In this exemplary embodiment, the use of defective lines is prevented during allocation of new lines. When a line is considered for replacement, the defect designation structure is referenced to determine if the particular line is defective. In this embodiment, bits of defect designation structure 101C0 and 101C1 are used by error control logic 651A and 651B, respectively, to signal replacement logic 614 or 653 to prevent the defective line from ever being allocated and therefore never used.

Figure 7:
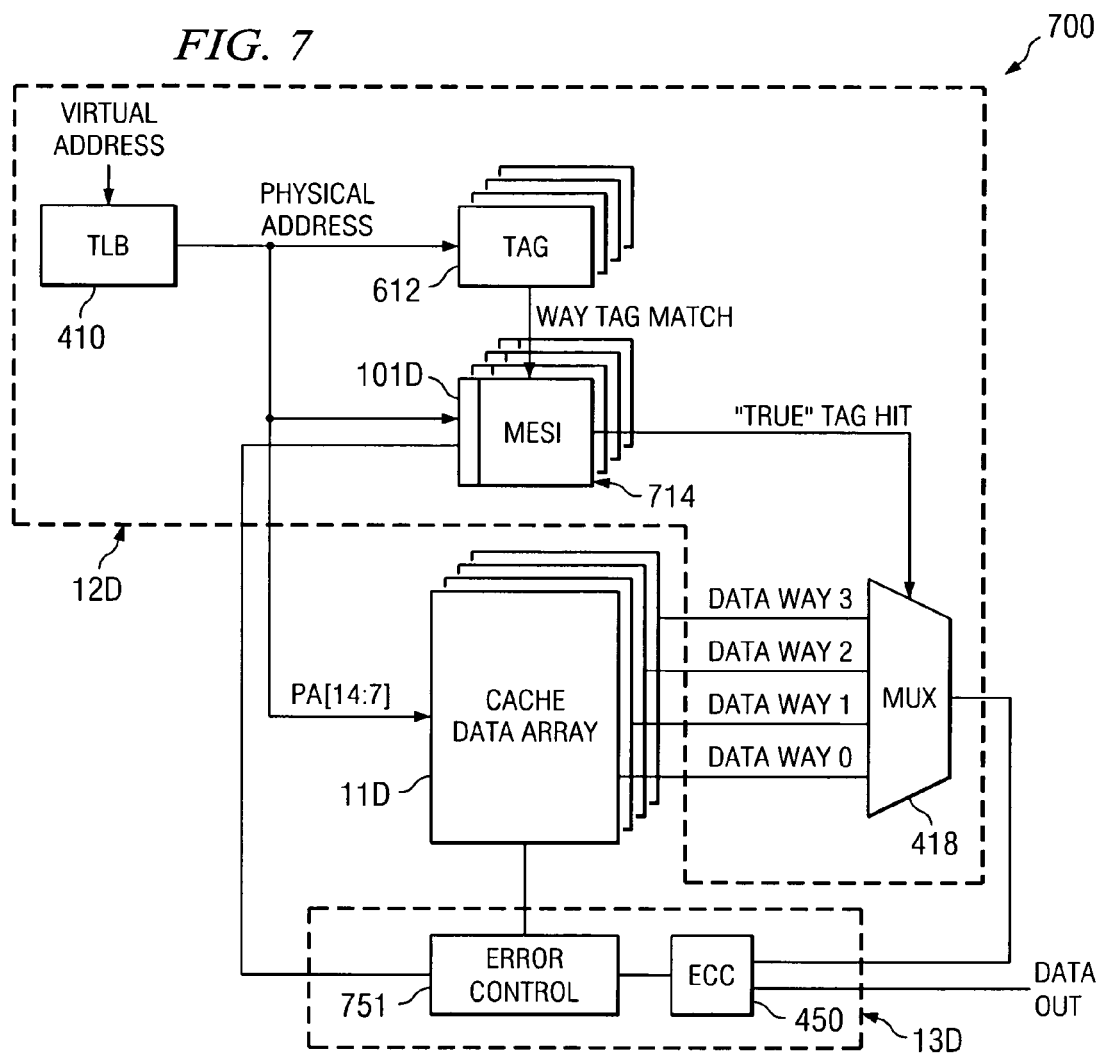
FIG. 7 shows an exemplary system employing still another embodiment of the present invention, wherein bits are included as part of a MESI signal for designating defective portions of memory.

FIG. 7 shows an exemplary system 700 employing still another embodiment of the present invention, wherein bits are included as part of a MESI signal for designating defective portions of memory. System 700 includes an exemplary level of cache (e.g., cache level L0 of FIGS. 4-6), and while a single level of cache is shown in FIG. 7 it may, as in FIGS. 4-6, include further levels of cache. As with FIGS. 4-6, the exemplary cache design of FIG. 7 is provided merely for illustrative purposes and represents how a cache design commonly employed in computer systems may be adapted to implement one embodiment of the present invention. Of course, embodiments of the present invention are not limited in application to the exemplary cache design shown in FIG. 7, but may be readily employed in various other cache designs as those of ordinary skill in the art will appreciate.

Cache designs, such as the exemplary designs of FIGS. 4-6 described above, typically generate control data indicating whether a "true" cache hit has been achieved for a level of cache, and the cache data is actually accessed to satisfy the memory access request for a true cache hit. A true cache hit occurs when a processor requests an item from a cache and the item is actually present in the cache. A cache "miss" occurs when a processor requests an item from a cache and the item is not present in the cache. The control data indicating whether a "true" cache hit has been achieved for a level of cache typically comprises a tag match signal. As described above, the tag match signal indicates whether a match was made for a requested address in the tags of a cache level. However, such a tag match signal alone does not indicate whether a true cache hit has been achieved. Rather, a MESI signal is also often included for determining whether a true cache hit is achieved.

As an example, in a multi-processor system, a tag match may be achieved for a cache level, but the particular cache line for which the match was achieved may be invalid. For instance, the particular cache line may be invalid because another processor has snooped out that particular cache line. Accordingly, in multi-processor systems a MESI signal is also typically utilized to indicate whether a line in cache is "Modified and Exclusive, Shared, or Invalid." Therefore, the control data that indicates whether a true cache hit has been achieved for a level of cache typically comprises a MESI signal, as well as the tag match signal. Only if a tag match is found for a level of cache and the MESI protocol indicates that such tag match is valid, does the control data indicate that a true cache hit has been achieved.

Thus, in FIG. 7 shows an exemplary level of cache (e.g., cache level L0 of FIGS. 4-6). As described above, a virtual address is input into TLB 410, which provides a translation from the received virtual address to a physical address. Within a computer system, the virtual address space is typically much larger than the physical address space. The physical address space is the actual, physical memory address of a computer system, which includes cache, main memory, a hard drive, and anything else that the computer can access to retrieve data. Thus, for a computer system to be capable of accessing all of the physical address space, a complete physical mapping from virtual addresses to physical addresses is typically provided. Once the received virtual address is translated into a physical address by the TLB 410, the index field of such physical address is input into the cache level's tag array 612, which may be duplicated N times for N "ways" of associativity. The physical address index is also input to the cache level's data array(s) 11D, which may also be duplicated N times for N ways of associativity.

From the cache level's tag array 612, a way tag match signal is generated for each way. The way tag match signal indicates whether a match for the physical address was made within the cache level's tag array 612. As discussed above, in multi-processor systems, a MESI protocol is typically utilized to indicate whether a line in cache is modified and exclusive, shared, or invalid. Accordingly, in such multi-processor systems the MESI protocol is combined with the way tag match signal to indicate whether a "true" tag hit has been achieved for a level of cache. Thus, in multi-processor systems a true tag hit is achieved when both a tag match is found for tag array 612 and the MESI protocol indicates that such tag match is a valid match. Accordingly, in FIG. 7, MESI circuitry 714 is utilized to calculate a "true" tag hit signal to determine whether a true tag hit has been achieved for that level of cache. It should be understood that while not expressly shown in the above exemplary systems of FIGS. 4-6, MESI circuitry may likewise be included in those implementations as well for determining a "true" tag hit, as those of ordinary skill in the art will readily appreciate.

Once it is determined from the MESI 714 that a "true" tag hit has been achieved for that level of cache, then that cache level's data array(s) 11D, which may also be duplicated N times for N ways of associativity, are accessed to satisfy the received memory access request. More specifically, the true tag hit signal may be used to control a multiplexer ("MUX") 418 to select the appropriate data array way to output data to satisfy the received memory access request. The selected data from data array(s) 11D may be output to the chip's core circuitry (not shown), which refers to the particular execution unit (e.g., an integer execution unit or floating point execution unit) that issued the memory access request to the cache.

As shown in the example of FIG. 7, access control logic 12D is implemented for controlling access to the data array 11D (e.g., the L0 data array). This provides an exemplary implementation of access control logic 12 of FIG. 1. In this exemplary embodiment, one or more defect designation bits 101D are included in the MESI circuitry 714 for designating whether a portion of memory is defective. Thus, in this embodiment, data is included within the MESI signal generated by logic 714 for implementing the designation logic 101 of FIG. 1.

In the example of FIG. 7, an exemplary implementation of defect detection logic 13 of FIG. 1 is shown as defect detection logic 13D, which includes ECC logic 450 and error control logic 751. Of course, defect detection logic 13 is not limited to this exemplary implementation, but logic 13D provides one illustrative implementation that may be employed. ECC logic 450 performs error detection for the data read from cache data array(s) 11D in the manner well-known in the art. Upon detecting an error, ECC logic 450 signals the error and generates an interrupt to invoke a routine in error control logic 751. The error control routine re-writes the corrected data (corrected by ECC logic 450) to the memory address from which it was read, and then re-reads the data to determine whether the error is a soft error or a hard error (as in operational blocks 302-306 of FIG. 3). If determined that the error is a hard error, then in this embodiment error control logic 751 updates the defect designation bit(s) in the corresponding MESI signal for the memory address for which the error was detected to designate such address as defective.

By defining a new MESI state, named "Defective" in this example, defective information can be stored in a similar fashion as in FIGS. 4-6. In many implementations, the MESI state is encoded to save space, but not all possible encodings are used. For example, in a system with four states, Modified, Exclusive, Shared or Invalid implemented with 3 bits, only four of the possible state encodings are used. By encoding the Defective state in one of the unused state encodings, defective line information may be stored without requiring any additional memory storage bits (as was the case for FIGS. 4-6). Detecting the Defective state requires a small amount of control logic.

Figure 8:
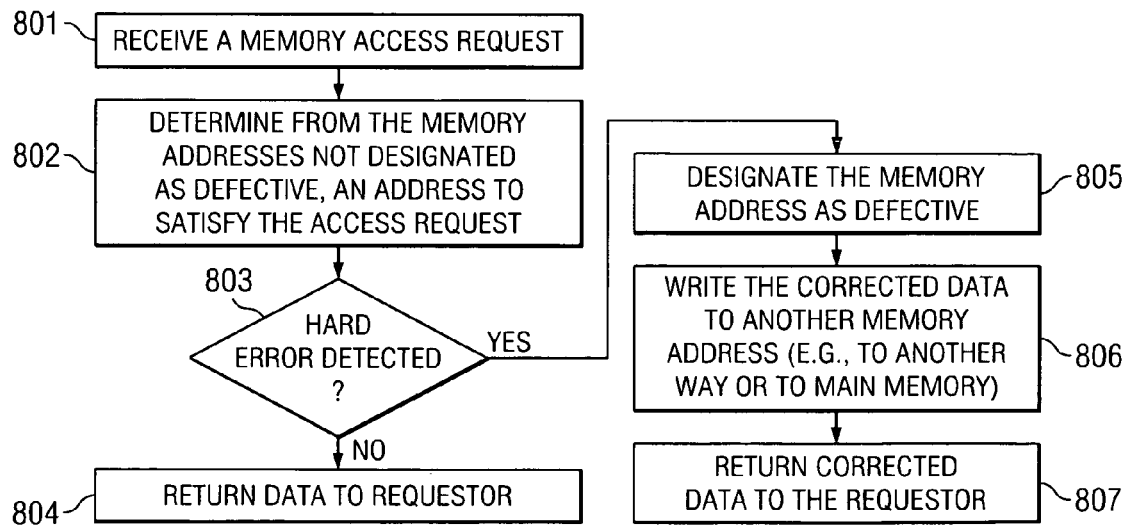
FIG. 8 shows an operational flow diagram for handling memory access requests in accordance with an embodiment of the present invention.

FIG. 8 shows an operational flow diagram for handling memory access requests in accordance with an embodiment of the present invention. In operational block 801, access control logic (e.g., logic 12 of FIG. 1) receives a memory access request from a requestor (e.g., a requesting functional unit of a computer system). In operational block 802, the access control logic determines, from the memory addresses not designated as defective, an address to satisfy the access request. Thus, the access control logic avoids attempts to access any memory addresses that are designated as defective. In operational block 803, a determination is made whether a hard error is detected for the requested memory address. As described above, such hard error may be detected as in blocks 301-306 of FIG. 3, for instance. If a hard error is not detected, then operation advances to block 804 where the data is returned from the memory address to the requester. If a hard error is detected for the requested memory address, operation advances from block 803 to block 805 where the memory address is designated as defective. Such memory address may be designated as defective by storing data in any of the ways described above, for example. In operational block 806, the data is corrected (e.g., by ECC logic) and the corrected data is written to another memory location that is not designated as defective. For instance, the corrected data may be written to another way of a multi-way cache structure through the modified replacement algorithm. It may be stored in the memory elements located in the defect designation structures of FIG. 6. Or finally, the corrected data may be written to main memory or some other higher level of cache with some performance penalty. In operational block 807, the corrected data is returned to the requester. Thereafter, in servicing a future memory access request received in block 801, the memory address designated as defective in block 805 is not attempted to be accessed in block 802.

The above-described exemplary implementations are extremely versatile. While primarily intended to provide immunity to latent defects (defects that manifest themselves only after operation in a product), it is possible to utilize these implementations at any point n the manufacturing flow. This provides immunity to subtle defects that escape manufacturing test. While most latent defects will likely manifest themselves as single bit defects, these methods can provide immunity to defects that cause multiple defective RAM cells, such as a row, column or sub-block failures. The use of ECC to detect and correct defects provides real-time recovery, but it is also possible to store the defective line locations in non-volatile memory on or off the die and re-configured during the power up and boot process. And finally, the defect limits (the maximum number of defects allowed before signaling that service is required) can be completely configurable in HW, firmware, or even at the customer level.

What is claimed is:

1. A method comprising:
   detecting a defect in a portion of random access memory;
   detecting whether a hard error occurred in said portion of random access memory;
   designating said portion of random access memory as defective when said hard error occurs in said portion of random access memory; and
   avoiding attempts to access said portion of random access memory designated as defective.

2. The method of claim 1 wherein said designating comprises:
   storing data identifying said portion of random access memory as defective.

3. The method of claim 2 wherein said avoiding comprises:
   accessing said stored data and based on said stored data avoiding attempts to access said portion of random access memory designated as defective.

4. The method of claim 2 further comprising:
   accessing said stored data upon a request to access said portion of random access memory.

5. The method of claim 2 further comprising:
   storing said data within a tag array.

6. The method of claim 2 further comprising:
   storing said data within a replacement array.

7. The method of claim 2 further comprising:
   storing said data as part of MESI data.

8. The method of claim 1 further comprising:
   receiving a designation of a number of acceptable defects detected in said memory before service is required.

9. The method of claim 1 wherein said designating said portion of random access memory as defective when said hard error occurs in said portion of random access memory comprises:
   including data designating said portion of random access memory as defective in an access structure that is otherwise used for accessing non-defective portions of the random access memory.

10. The method of claim 9 wherein said access structure comprises at least one of a tag array, replacement array, and MESI data.

11. The method of claim 1 wherein detecting whether a hard error occurred in said portion of random access memory comprises:
    detecting a single-bit error in said portion of random access memory;
    writing a corrected single-bit into said portion of random access memory;
    reading said corrected single-bit from said portion of random access memory;
    indicating said hard error occurred if said corrected single-bit read from said portion of random access memory is incorrect.

12. A system comprising:
    non-sequential access memory;

defect detection logic for detecting a hard error in said non-sequential access memory;

data structure for storing data designating a portion of non-sequential access memory as defective when said hard error is detected by said defect detection logic; and access control logic for controlling access to said non-sequential access memory, wherein based at least in part on said data structure said access control logic avoids attempts to access said portion of non-sequential access memory designated as defective.

13. The system of claim 12 wherein said defect detection logic comprises error correction coding (ECC) logic.

14. The system of claim 12 wherein said data structure comprises a tag array.

15. The system of claim 12 wherein said data structure comprises a replacement array.

16. The system of claim 12 wherein said data structure comprises MESI data for said non-sequential access memory.

17. A system comprising:
means for detecting whether a hard error occurred in a portion of memory;

means for designating said portion of memory as defective when said hard error occurs in a portion of said memory, wherein said means for designating said portion of memory as defective is included in an access structure that is used for accessing non-defective portions of said memory; and means for avoiding attempts to access said portion of memory designated as defective.

18. The system of claim 17 wherein the designating means comprises a tag array having data stored therein that designates said portion of memory as defective.

19. The system of claim 17 wherein the designating means comprises a replacement array having data stared therein that designates said portion of memory as defective.

20. The system of claim 17 wherein the designating means comprises a MESI signal, a portion of which designates said portion of memory as defective.

21. The system of claim 17 wherein said memory comprises non-sequential access memory.

* * * * *

UNITED STATES PATENT AND TRADEMARK OFFICE
CERTIFICATE OF CORRECTION

| | | |
|---|---|---|
| PATENT NO. | : 7,430,145 B2 | Page 1 of 1 |
| APPLICATION NO. | : 11/229084 | |
| DATED | : September 30, 2008 | |
| INVENTOR(S) | : Donald R. Weiss et al. | |

It is certified that error appears in the above-identified patent and that said Letters Patent is hereby corrected as shown below:

In column 16, line 13, in Claim 19, delete "stared" and insert -- stored --, therefor.

Signed and Sealed this

Thirtieth Day of December, 2008

JON W. DUDAS
*Director of the United States Patent and Trademark Office*